(12) United States Patent
Yun

(10) Patent No.: US 6,683,312 B2
(45) Date of Patent: Jan. 27, 2004

(54) ULTRAVIOLET CLEANING APPARATUS OF A SUBSTRATE AND THE METHOD THEREOF

(75) Inventor: Heon Do Yun, Taegu (KR)

(73) Assignee: LG.Philips LCD Co., Ltd., Seoul (KR)

( * ) Notice: Subject to any disclaimer, the term of this patent is extended or adjusted under 35 U.S.C. 154(b) by 435 days.

(21) Appl. No.: 09/749,679

(22) Filed: Dec. 28, 2000

(65) Prior Publication Data

US 2001/0043478 A1 Nov. 22, 2001

(30) Foreign Application Priority Data

Dec. 31, 1999 (KR) .......................... P99-68069

(51) Int. Cl.[7] .............................................. G01N 21/00
(52) U.S. Cl. ................. 250/455.1; 250/453.1; 250/454.1; 250/504; 422/22; 430/329
(58) Field of Search ........................ 250/453.1, 454.1, 250/455.1, 492.1, 503.1, 504, 494.1; 422/22; 430/329; 134/1.1, 1.2, 1.3

(56) References Cited

U.S. PATENT DOCUMENTS

| | | | | | |
|---|---|---|---|---|---|
| 5,083,030 | A | * | 1/1992 | Stavov | 250/453.11 |
| 5,459,322 | A | * | 10/1995 | Warkentin | 250/455.11 |
| 5,547,642 | A | * | 8/1996 | Seiwa et al. | 422/186.3 |
| 6,143,477 | A | * | 11/2000 | Rhieu | 430/329 |

\* cited by examiner

Primary Examiner—John R. Lee
Assistant Examiner—David A. Vanore
(74) Attorney, Agent, or Firm—Birch, Stewart, Kolasch & Birch, LLP

(57) ABSTRACT

An ultraviolet cleaning apparatus wherein a substrate is pre-heated prior to a conveyance of the substrate into the cleaning apparatus to thereby shorten the process time. In the apparatus, a substrate pre-heater pre-heats the substrate. An ultraviolet cleaner irradiates ultraviolet rays onto the substrate to remove the remaining substances on the substrate.

23 Claims, 3 Drawing Sheets

ULTRAVIOLET CLEANING APPARATUS OF A SUBSTRATE AND THE METHOD THEREOF

BACKGROUND OF THE INVENTION

1. Field of the Invention

The present invention relates to an apparatus for fabricating a liquid crystal display, and more particularly to an ultraviolet cleaning apparatus wherein a substrate is pre-heated prior to a conveyance of the substrate into the cleaning apparatus to thereby shorten the process time.

2. Description of the Related Art

Generally, since a liquid crystal display (LCD) has advantages of small size, thin thickness and low power consumption, it has been used for notebook personal computers, office automation equipment and audio/video equipment, etc.

A process of fabricating such a LCD will be briefly described below. First, an upper plate having color filters and a black matrix of a light-shielding layer formed on a transparent substrate and a lower plate having a thin film transistor array and a driving circuit formed on the transparent substrate are manufactured. Next, the upper plate and the lower plate are cleaned with ultraviolet rays to eliminate the remaining material. The cleaned upper and lower plates are adhered to each other. After the adhesion of the lower plate and the upper plate, a liquid crystal is injected to complete the LCD.

Referring to FIG. 1, a conventional ultraviolet (UV) cleaning apparatus includes UV lamps 2 for irradiating a UV ray, a UV lamp house 4 for housing the UV lamps 2, a cooling water supply line 6 for receiving a cooling water from a cooling water supply (not shown) so as to keep the UV lamp house 4 at less than a desired temperature, a nitrogen-injecting hole 8 supplied with nitrogen so as to uniformly maintain the pressure between the UV lamp house 4 and a chamber 18, and a quartz window 10 for passing only a specific wavelength of the UV ray. The UV lamps 2 irradiate UV rays so as to remove the remaining material on the substrate. The cooling water supply line 6 receives cooling water from the cooling water supply (not shown) so as to prevent the UV lamp house 4 from rising beyond a desired temperature upon irradiation with the UV rays. The nitrogen-injecting hole 8 receives nitrogen from a nitrogen supply (not shown) so as to prevent the quartz window 10 from being damaged due to a pressure difference between the UV lamp house 4 and the chamber 18.

A process of cleaning the substrate 14 will be described below. First, the substrate 14 is conveyed from a cassette (not shown), via a conveyor, into the chamber 18. When the substrate 14 has been conveyed into the chamber 18, UV rays from the UV lamps 2 irradiate onto the quartz window 10. At this time, nitrogen is fed from the nitrogen supply (not shown) to the nitrogen-injecting hole 8. The nitrogen fed to the nitrogen-injecting hole 8 prevents the quartz window 10 from being damaged due to a pressure difference between the UV lamp house 4 and the chamber 18 and improves the transmissivity of the UV rays. The quartz window 10 passes only a specific wavelength band of about 172 nm in UV rays irradiated from the UV lamps 2 to remove the remaining substances from the substrate 14.

However, the conventional UV cleaning apparatus has the drawback in that, since it requires a considerable time to remove the substances of the substrate, a deterioration in productivity is caused.

SUMMARY OF THE INVENTION

Accordingly, it is an object of the present invention to provide an ultraviolet cleaning apparatus wherein a substrate is pre-heated prior to the conveyance of the substrate into the cleaning apparatus, whereby the processing time is effectively shortened.

It is another object of the present invention to provide a substrate cleaning method wherein a substrate is pre-heated to activate substances of the substrate and improve productivity. Also, in this process, for example, the deposition of an organic and/or an inorganic material on the substrate can be done effectively.

In order to achieve these and other objects of the present invention, an ultraviolet cleaning apparatus according to an embodiment of the present invention includes: a pre-heater for heating the substrate; and an ultraviolet cleaner for irradiating ultraviolet rays onto the substrate to remove the remaining substances on the substrate.

An ultraviolet cleaning apparatus according to another embodiment of the present invention includes an ultraviolet lamp house for housing ultraviolet lamps; a quartz window for selectively passing ultraviolet rays from the ultraviolet lamps; a chamber for conveying the substrate; and a pre-heater for heating the substrate so as to activate substances on the substrate.

An ultraviolet cleaning apparatus according to still another embodiment of the present invention includes an ultraviolet lamp house for housing ultraviolet lamps; a quartz window for selectively passing ultraviolet rays from the ultraviolet lamps; a chamber for conveying the substrate; and a heater for heating the substrate so as to remove substances from the substrate.

A substrate cleaning method according to an embodiment of the present invention includes: pre-heating the substrate using a pre-heater so as to activate substances on the substrate; conveying the substrate into a chamber; and irradiating the substrate with ultraviolet rays from ultraviolet lamps so as to remove the substances on the substrate.

A substrate cleaning method according to another embodiment of the present invention includes: conveying the substrate into a chamber; heating the substrate using a heater so as to activate substances on the substrate; and irradiating the substrate with ultraviolet rays from ultraviolet lamps so as to remove the substances on the substrate.

BRIEF DESCRIPTION OF THE DRAWINGS

These and other objects of the present invention will be apparent from the following detailed description of the embodiments of the present invention with reference to the accompanying drawings, wherein.

DETAILED DESCRIPTION OF THE PREFERRED EMBODIMENT

Figure 1:
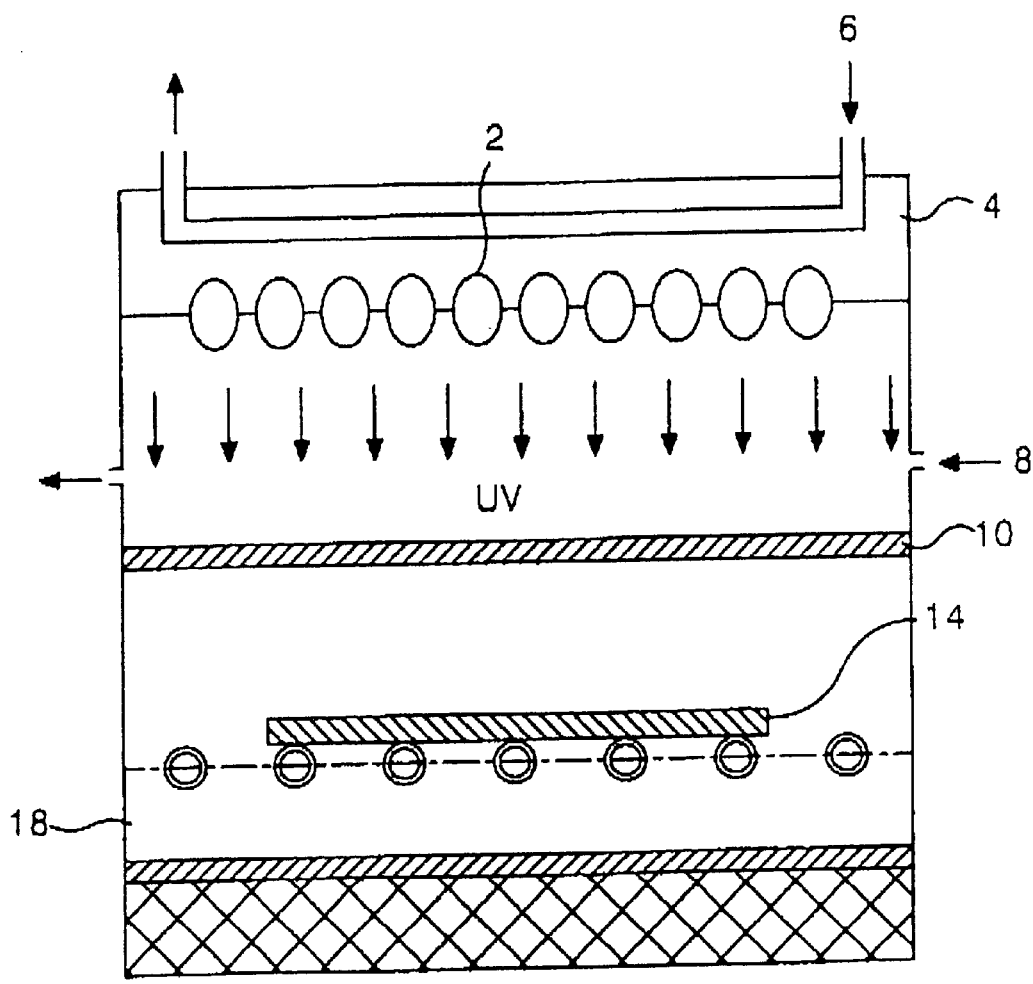
FIG. 1 is a section view showing a structure of a conventional ultraviolet cleaning apparatus.
Figure 2:
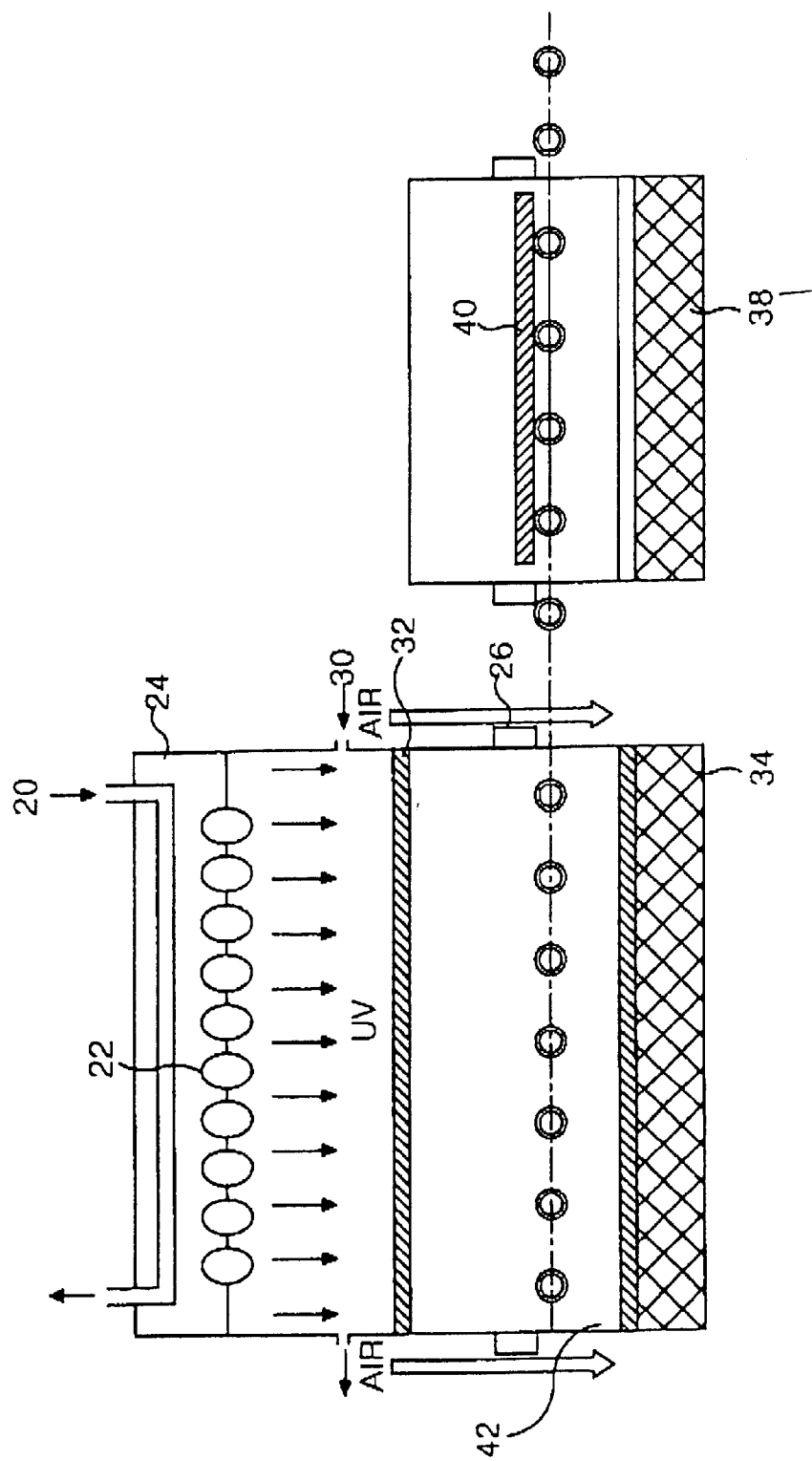
FIG. 2 and FIG. 3 are sectional views for explaining the operation of the ultraviolet cleaning apparatus according to various embodiments of the present invention.

Referring to FIG. 2, there is shown an ultraviolet cleaning apparatus according to one embodiment of the present invention. The present ultraviolet cleaning apparatus has the same elements and features as the conventional ultraviolet cleaning apparatus except that it includes a substrate pre-heater 38 for pre-heating substrate 40, and an air tube for forming an air curtain in front of doors 26. More specifically, the present ultraviolet cleaning apparatus includes UV lamps 22 for irradiating with UV rays, an UV lamp house 24 for housing the UV lamps 22, cooling water supply line 20 for receiving a cooling water from a cooling water supply (not shown) so as to maintain the UV lamp house 24 at less than a desired temperature. A nitrogen-injection hole 30 supplied with a nitrogen so as to uniformly keep a pressure between the UV lamp house 24 and a chamber 42, a quartz window 32 for passing only a specific wavelength of the UV ray, and a heater 34 for heating a substrate 40 into more than a desired temperature.

The substrate pre-heater 38 pre-heats the substrate 40 into more than a desired temperature so as to activate a reaction of the remaining substances on the substrate 40 to an ozone produced by a reaction between a UV ray and an oxygen. The UV lamps 22 irradiate an UV ray so as to dissolve the remaining substances on the substrate. The quartz window 32 passes only a specific wavelength band of about 172 nm in a UV ray irradiated from the UV lamps 22 in which the UV ray reacts with an oxygen ($O_2$) to produce an ozone ($O_3$). The present invention may be formed at least one of the heater 34 and the pre-heater 38.

Figure 3:
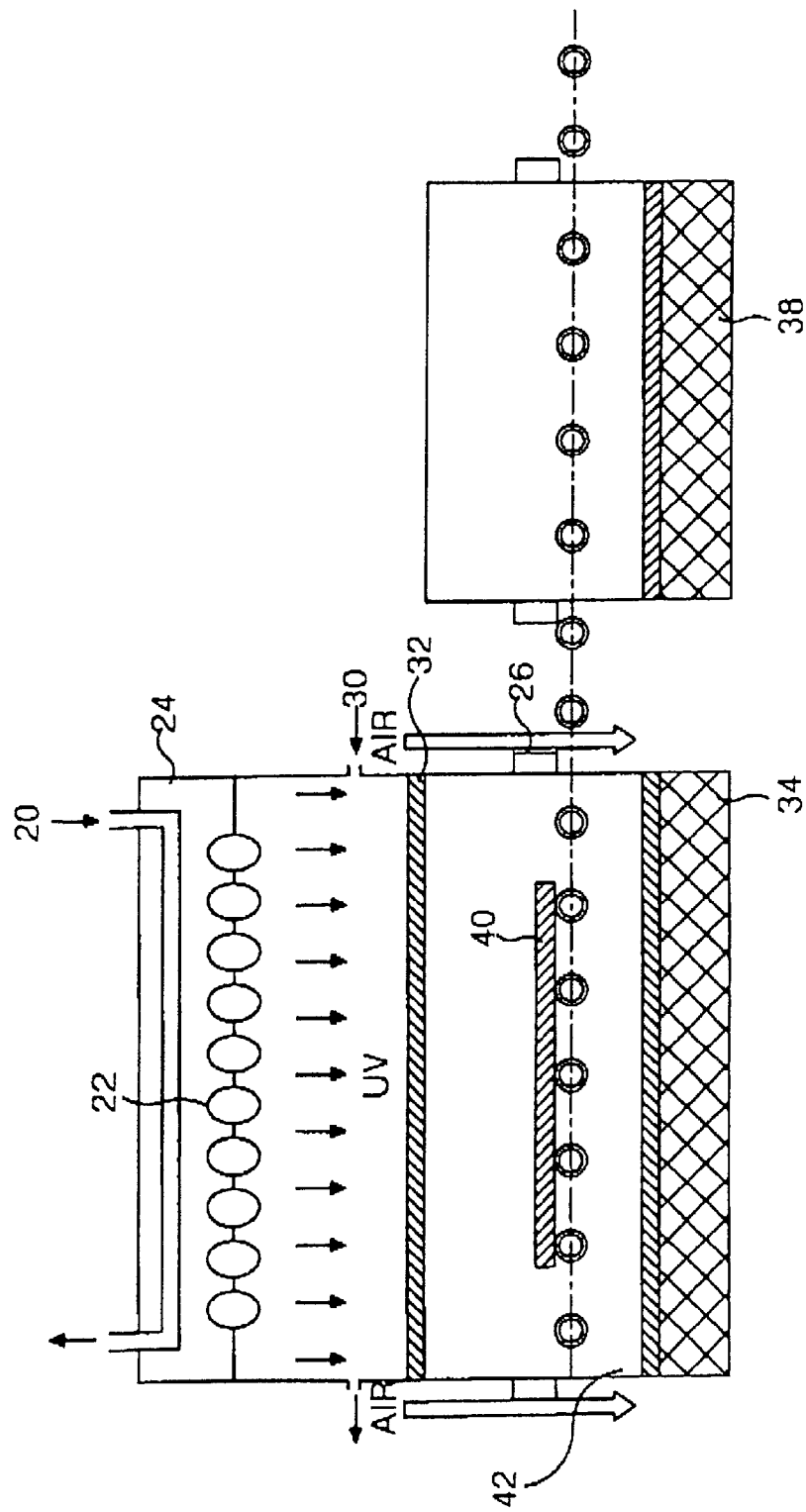

A process of cleaning the substrate 40 will be described below. First, the substrate 40 supplied from a cassette (not shown) is conveyed into the substrate pre-heater 38 by means of a conveyer. The substrate 40 having been conveyed into the substrate pre-heater 38 is heated to more than the desired temperature (e.g., about 250° C.) in the substrate pre-heater 38. The heated substrate 40 is conveyed to the chamber 42 by means of a conveyor as shown in FIG. 3. At this time, an air is ejected from an air tube (not shown) to form an air curtain in front of doors 26. The air curtain formed in front of the doors 26 prevents ozone within the chamber 42 from being leaked into the atmosphere and also supplies sufficient oxygen enough to produce ozone in the chamber 42. Advantageously, the air removes the substances on the substrate, whereby an ashing effect may be achieved.

When the substrate 40 has been conveyed into the chamber 42, UV rays from the UV lamps 22 are irradiated onto the quartz window 32. The quartz window 32 is designed to permit only a specific wavelength band of about 172 nm in the UV ray irradiated from the UV lamps 22 to pass therethrough. The UV ray which passes through the quartz window 32 reacts with the oxygen ($O_2$) within the chamber 42 to produce ozone ($O_3$). In this case, sufficient ozone can be produced from the oxygen introduced from the air curtain. The ozone ($O_3$) produced by the reaction between the UV ray and the oxygen reacts with the remaining substances on the substrate 40 to remove the remaining substances from the substrate 40. In other words, a molecular binding of organic substances which are the remaining materials disposed on the substrate, is effected to disconnect these materials from the substrate with the aid of $O_2$, O and $O_3$ generated from the UV lamps 22, which are converted into $CO_2$, CO and $H_2O$. In other words, the organic material is eliminated by taking advantage of the ashing effect. At this time, oxygen is inputted to disconnect a molecular binding of the organic substance so as to facilitate a binding between the molecules and also improve the ashing effect.

As described above, according to the present invention, the substrate is preheated to shorten the process time. Also, the air curtain is formed in front of the doors of the chamber, thereby supplying sufficient oxygen to the chamber, preventing ozone within the chamber from escaping into the atmosphere, and activating substances on the substrate with ozone. That is, the ashing effect can be increased.

Advantageously, the present invention can provide a substrate having a smooth surface, whereby the deposition of an organic or inorganic material on the substrate, can be done effectively.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention.

What is claimed is:

1. An ultraviolet cleaning apparatus which comprises:
   a cleaning chamber;
   means for positioning a substrate to be cleaned within the chamber;
   means for irradiating the substrate to be cleaned with ultraviolet radiation; and
   means for heating the substrate prior to the application of ultraviolet radiation, wherein the heating means includes a pre-heater which heats the substrate prior to its introduction into the cleaning chamber.

2. The ultraviolet cleaning apparatus of claim 1, wherein a quartz window is disposed in the cleaning chamber between the means for irradiating and the substrate for selectively passing the ultraviolet rays therethrough.

3. The ultraviolet cleaning apparatus of claim 1, wherein the heating means includes a heater disposed within the cleaning chamber.

4. The ultraviolet cleaning apparatus of claim 1, wherein the pre-heater is disposed outside of the cleaning chamber.

5. The ultraviolet cleaning apparatus of claim 1, wherein conveying means are provided for conveying the substrate from the pre-heater to the cleaning chamber.

6. The ultraviolet cleaning apparatus of claim 1, further comprising air supply means disposed between the pre-heater and the cleaning chamber.

7. The ultraviolet cleaning apparatus of claim 1, wherein air supply means are provided for introducing air into the cleaning chamber.

8. An ultraviolet cleaning apparatus which comprises:
   a cleaning chamber;
   means for positioning a substrate to be cleaned within the chamber;
   means for irradiating the substrate to be cleaned with ultraviolet radiation;
   means for heating the substrate prior to the application of ultraviolet radiation; and
   cooling water supply means operatively associated with the irradiating means for controlling the temperature of said irradiation means.

9. An ultraviolet cleaning apparatus which comprises:
   a cleaning chamber;
   means for positioning a substrate to be cleaned within the chamber;
   means for irradiating the substrate to be cleaned with ultraviolet radiation;
   means for heating the substrate prior to the application of ultraviolet radiation; and
   a nitrogen-injection hole for maintaining the pressure between the irradiating means and the cleaning chamber.

10. An ultraviolet cleaning apparatus for cleaning a substrate which comprises:
    a cleaning chamber;

an ultraviolet light source disposed in the cleaning chamber;

a conveying means disposed in the cleaning chamber and adapted to support a substrate;

a quartz window disposed between the ultraviolet lamp source and the substrate; and a pre-heater disposed separate from the cleaning chamber for activating substances disposed on the substrate, said pre-heater being operatively associated with the cleaning chamber so that the pre-heated substrate can be introduced into the cleaning chamber.

11. The ultraviolet cleaning apparatus of claim 10, wherein the pre-heater is a chamber containing a heating means.

12. The ultraviolet cleaning apparatus of claim 11, wherein another conveying means is disposed in the pre-heater chamber for supporting the substrate, said another conveying means being adapted to convey the substrate from the pre-heating chamber to the conveying means in the cleaning chamber.

13. A method of cleaning a substrate which comprises:

pre-heating the substrate so as to activate substances on the substrate;

conveying the substrate into a chamber; and irradiating ultraviolet rays to remove the substances from the substrate.

14. The method of claim 13, wherein air is introduced into the chamber.

15. The method of claim 14, wherein the air activates the substances on the substrate.

16. The method of claim 13, wherein a quartz window is disposed between the ultraviolet rays and the substrate for permitting only specific wavelength bands to penetrate therethrough.

17. The method of claim 13, wherein the substrate is pre-heated to about 250° C.

18. A cleaning apparatus, comprising:

a cleaning chamber for receiving a substrate;

a pre-heater for heating the substrate prior to its introduction into said cleaning chamber; and an ultraviolet radiation source for irradiating the substrate with ultraviolet radiation.

19. The cleaning apparatus of claim 18, further comprising an air supply disposed between said pre-heater and said ultraviolet radiation source.

20. The cleaning apparatus of claim 18, further comprising a cooling water supply operatively associated with said ultraviolet radiation source for controlling the temperature of said ultraviolet radiation source.

21. The cleaning apparatus of claim 18, further comprising a nitrogen-injection hole for maintaining the pressure between said ultraviolet radiation source and said cleaning chamber.

22. The cleaning apparatus of claim 18, further comprising a heater disposed within said cleaning chamber.

23. The cleaning apparatus of claim 18, further comprising a quartz window disposed between said ultraviolet radiation source and the substrate.

* * * * *